United States Patent [19]

Gillett et al.

[11] Patent Number: 4,879,433

[45] Date of Patent: Nov. 7, 1989

[54] PARALLEL CABLE BUS WITH INTERNAL PATH LENGTH COMPENSATION

[75] Inventors: John B. Gillett, Woodstock; Fred H. Lohrey, Poughkeepsie; Jerry A. Lorenzen, Stone Ridge, all of N.Y.

[73] Assignee: International Business Machines Corporation, Armonk, N.Y.

[21] Appl. No.: 265,064

[22] Filed: Oct. 31, 1988

[51] Int. Cl.[4] .............................................. H01B 7/08
[52] U.S. Cl. ................................ 174/32; 174/117 FF; 174/268
[58] Field of Search ...... 174/117 F, 117 FF, 117 PC, 174/117 R, 32; 361/407, 408

[56] References Cited

U.S. PATENT DOCUMENTS

| 2,703,854 | 3/1955 | Eisler | 174/117 FF |
| 3,633,189 | 1/1972 | Billawala | 174/117 FF X |

FOREIGN PATENT DOCUMENTS 1215226  4/1966  Fed. Rep. of Germany ... 174/117 F

Primary Examiner—Morris H. Nimmo
Attorney, Agent, or Firm—Robert L. Troike

[57] ABSTRACT

A flat cable bus with fan-out patterns which provide equal length wires to eliminate clock skew is disclosed.

7 Claims, 2 Drawing Sheets

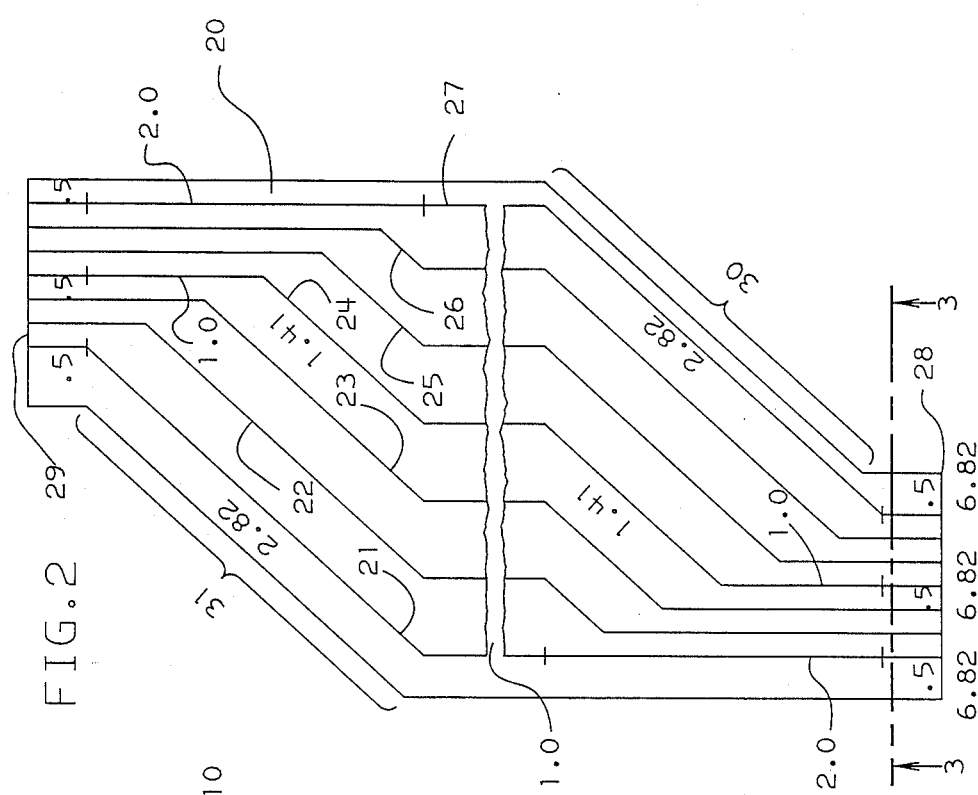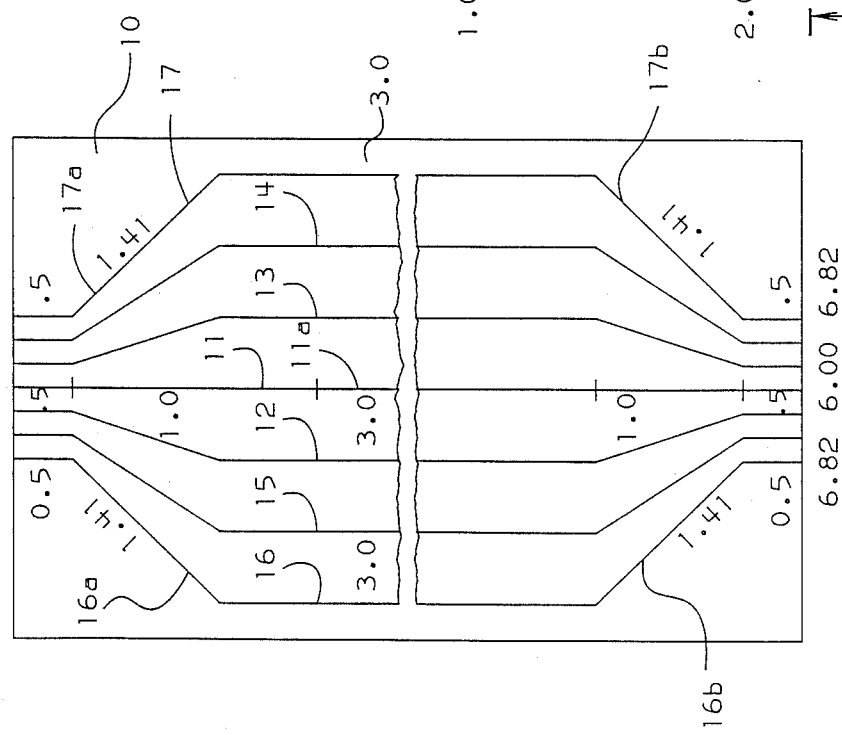

PARALLEL CABLE BUS WITH INTERNAL PATH LENGTH COMPENSATION

This invention relates to parallel cable bus of the type to be connected between very high speed computers and more particularly to a parallel cable bus wherein the wires fan out and yet all the wires within a flat cable bus have equal path lengths to reduce clock skew.

BACKGROUND OF THE INVENTION

High speed computers often use parallel flat cable bus comprising a plurality of conductors arranged side by side in a common plane spaced and insulated from each other in a ribbon of dielectric material. In addition it is desirable that the cables go from a narrow, high density area to a wide transmission area. The wide cable area can maximize the signal propagation characteristics and increase the manufacturing yield of the flat cables. In the prior art generally these flat cables go from a broad terminal end to a narrow transmission section and then back to being broad at the other terminating end. The purpose of the broadening is to have connector pads and make easy access to connectors. The connectors at the terminating end would be roughly ten conductors per inch. In an effort to reduce the space taken up by the connectors at the terminal end, especially for large high speed computers requiring multiple harnesses, is desirable that the terminating end width be as small as possible and these terminating ends are made even closer than the middle transmission section. The transmission sections are wider so as to prevent resistive losses and other characteristic problems. This density at the terminating ends may be on the order of 100 conductors per inch. The conventional manner in which these cables are made is a fan-out pattern as shown in the prior art in FIG. 1. The wires on the outside of the cable are longer than the central wires. Specifically for one inch connector widths to a three inch transmission cable the maximum difference is 0.82 inch. At expected future signal propagation velocities, this results in a time skew of 130 picoseconds. In a typical processor/memory/processor loop of a supercomputer this is multiplied by four to six consecutive flat cable buses. An example of such a system is described in application Ser. No. 176,495 filed Mar. 31, 1988 and entitled "High Performance Computer Package". The accumulated differential distance clock skew becomes a significant portion of the two to four nanosecond machine cycle that would be necessary for this type of computer.

SUMMARY OF THE INVENTION

In accordance with one embodiment of the present invention the differential distance clock skew is eliminated by high performance flat cable comprising a plurality of conductors arranged side by side in a common plane with a flat dielectric body covering said conductors and separating said conductors. The conductors within the body being relatively close at one of the remote ends and fanning out from said one end. The conductors are parallel to each other at the terminal ends and are arranged between the terminal ends to be of equal path length.

DESCRIPTION OF DRAWINGS

FIG. 1 is a sketch of a prior art flexible flat cable with a fan-out pattern which has unequal path lengths;

FIG. 2 is a view of a flexible flat cable of the type used in a harness in accordance with one embodiment of the present invention;

DESCRIPTION OF PREFERRED EMBODIMENT

Figure 4:
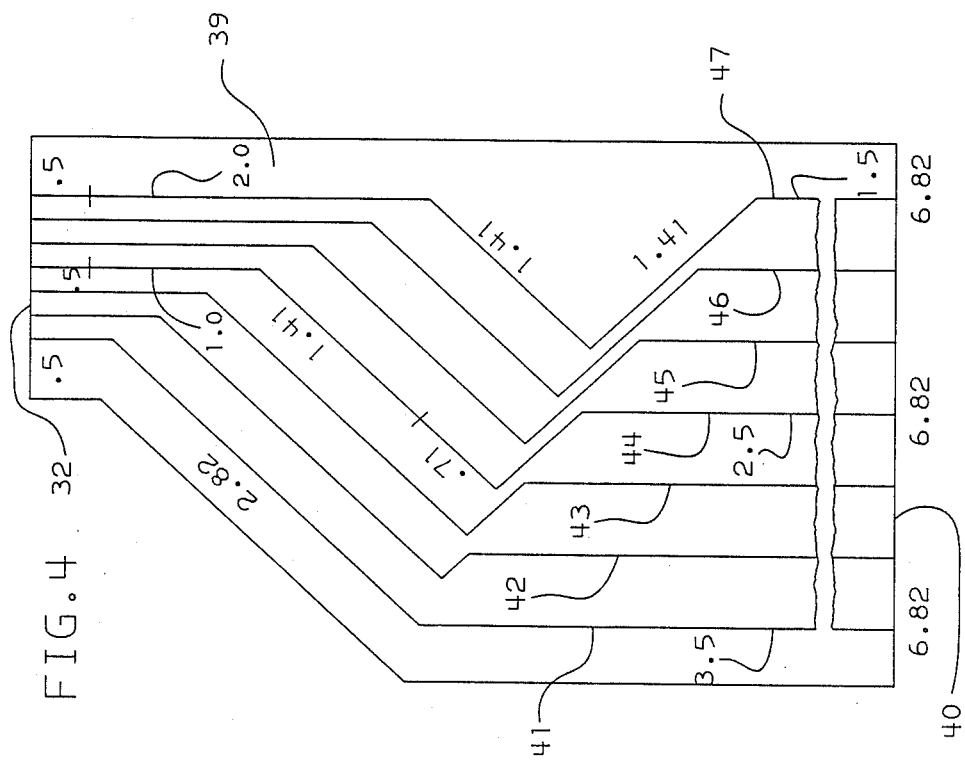
FIG. 4 is a plan view of a flexible flat cable of the type used in a harness in accordance with a second embodiment of the present invention.

Referring to FIG. 1 there is illustrated a sketch of the prior art fan-out flat cable 10 where the outboard conductor wires are substantially longer than the inner wires. For example, the central wire 11 may be six inches long with the parallel segments at each terminal end being half an inch (0.5 in.) long. The central section 11a of the center wire 11 is 3 inches long with both transition sections being an inch on either end. The transition sections 16a, 16b and 17a and 17b for the outermost wires 16 and 17 is 1.41 inches making the outermost wires 16 and 17 have a total maximum increase of 0.82 129 inches over the central wire 11. At expected signal propagation velocities, this results in a time skew of 130 picoseconds. In a typical processor/memory/processor loop of a supercomputer type configuration as mentioned previously this could be multiplied by four to six consecutive flat buses and the accumulated clock skew could become a significant portion in a two to four nanosecond machine cycle. This represents the problem for which the present invention overcomes.

Figure 3:
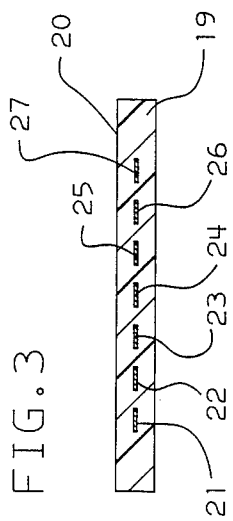
FIG. 3 is a view taken along the lines 3—3 of FIG. 2.

Referring to FIG. 2 there is illustrated a flat cable bus 20 according to one embodiment of the present invention wherein the conductors 21 through 27 are parallel to each other at the terminal ends 28 and 29 and the arrangement of these conductors therebetween is spread out to accommodate and maximize the signal propagation characteristics as with the prior art cable in FIG. 1 but without the unequal length conductors. Cable 20 may be of commonly known type of flat conductor cable in which the individual conductors 21–27 are contained in plastic film material 19, such as Mylar (polyethyleneterephthalate). See FIG. 3. Cable 20 has one end 28 which is narrow and adapted to be connected, for example to a printed circuit board, and a second end 29 which is also narrow and adapted to connect to a circuit board. The number of conductors in the cable for a specific harnessing situation is equal to the number of positions on each row of a printed circuit board. The conductors are relatively thin or narrow between adjacent portions and remain separated by the plastic dielectric material. The differential distance clock skew is eliminated in the diagonal transition sections where the conductors are angled at 45 degrees as illustrated in FIG. 2. FIG. 2 shows a one to three to one fan-out design where the width of the line expands from one inch at the terminal ends 28 and 29 to three inches in the middle or in the main transmission line portion which is represented by the one inch length in the sketch illustrating the 6.82 equal length lines. The middle or main transmission section 32 can be any desired length to accommodate the need. In the diagonal section 30 nearest end 28 the leftmost conductor 21 has no bend and is of minimum length (2 inches) and the rightmost conductor 27 has the most length and the longest diagonal portion (2.82 inches). Conductors 22 through 26 have increasingly longer diagonal sections and longer lengths. In the diagonal section 21 nearest end 29 the leftmost conductor 21 is of maximum added length (longest diagonal portion of 2.82 inches) which equals the diagonal portion of conductor 27 in section 30. Further, conductor 27 in transition section 31 is straight and of minimum length (2 inches). The middle conductor 24 has equal diagonal portions (1.41 inches) in sections 30 and 31 that total up to the diagonal portion of either conductor 21 or 27. The diagonal portions in section 30 progressively increase for conductors 22 through 27 and the diagonal portions in section 31 progressively decrease for conductors 22 through 26 such that all of the conductors 21-27 are of equal electrical length. In this way the conductor lengths are the same. For example, the left-most conductor 21 line remains straight for the first 3.5 inches (one inch representing the main transmission line section which may be any number of feet) then extends on a 2.82 inch diagonal to a half inch portion at end 29. The total length of conductor 21 with the midsection being at the common one inch is 6.82 inches. Likewise the other conductors 22 through 27 have the same total length. Conductor 27 has the 2.82 inch diagonal portions in sections 30 and straight in the other sections. The middle conductor 24 has half of the diagonal portion in each section 30 and 31. Conductor 22 has the shortest diagonal portion (other than zero) in section 30 and conductor 26 has the same diagonal length section in section 31. The remaining length to provide the total of 6.82 inches is in the opposite section. Likewise this is true for conductors 23 and 25 as shown.

Referring to FIG. 4 there is illustrated, a design wherein the fan-out is at only one end of a cable 39 wherein there is a wide terminal end 40 such as 3 inches for example and a narrow terminal end 32 such as one inch wherein the conductors at terminal 40 are widely spaced and parallel and the conductors at the terminal 32 are closely spaced and parallel. In the arrangement of FIG. 4 the conductors are again embedded in a plastic mylar tape with the conductors parallel to each other and spaced by the dielectric and it may be a flexible medium. In this path length adjustment the conductors are again equalized with the conductor 41 having a length of 6.82 inches with a 45 degree diagonal section 2.82 inches long. The conductor 47 at the opposite side has a bi-directional section of a 45 degree bend, a 90 degree bend and 45 degree bend to provide a v-loop where each of the legs are 1.41 inches. The central conductor 44 has an asymmetrical v-loop with 2.11 inches in the diagonal nearest end 32 and only 0.7 inch nearest end 40. The v-loops in conductors 42 to 47 total 2.82 inches and get increasingly shorter at end 32 and longer at end 40 with 90 degree bend between legs of the bend as shown in FIG. 4.

While the disclosed invention describes certain cables and dimensions and angles of bend of the conductors, changes in construction will occur to those skilled in the art and various apparently different modifications may be made without departing from the scope of the invention.

The matter set forth in the accompanying drawings is being offered by way of illustration only. The density may be for example 100 conductors per inch at the narrow end to 100 conductors to three inches. Only seven is shown for illustration purposes.

What is claimed is:

1. A high performance flat cable comprising:
   a plurality of conductors arranged parallel side-by-side in a common plane in a dielectric body;
   said conductors within said body being relatively close at one of the remote ends and fanning out from said one end to provide more widely spaced parallel conductors; and
   said conductors being of equal path lengths from said one end to an opposite end.

2. The combination of claim 1 wherein said conductors have tapering sections between said ends which are of unequal lengths and parallel transmission line sections.

3. The cable of claim 2 wherein said conductors in said tapering sections are angled at a 45 degree angle from the termination end.

4. The cable of claim 1 wherein at said one and opposite ends said conductors are closely spaced and parallel and wherein adjacent and inboard each of said ends there is a separate tapering section with a first conductor nearest one side of the cables in first tapering section near said one end being straight and in a second tapering section nearest said opposite end being the longest diagonal section and wherein a second conductor nearest the side of said cable opposite said one side in said first tapering section being the longest diagonal section and being straight in said second tapering section such that the overall lengths of the two conductors are equal.

5. The combination of claim 4 previously wherein the center conductor has equal length diagonal lines in both tapering sections that total said longest diagonal line length.

6. The combination of claim 1 wherein each of said ends of said conductors includes a tapering line section where in a first tapering line section a first conductor nearest one side of said line is straight and each of said conductor toward an opposite side have progressively longer diagonal sections and in a second tapering line section at the opposite end of the line said first conductor has the longest diagonal section and each of said conductors toward said opposite side has progressively shorter diagonal section.

7. The combination of claim 1 wherein at a first end the conductors are widely spaced and at the opposite end said conductors are more narrowly spaced and wherein said conductors along one edge of the line has a symmetrically v-shaped bend and said conductors toward said opposite edge have a progressively less symmetrical bend and where the total length of the legs of the bend being constant.

* * * * *